United States Patent
Pandey et al.

(10) Patent No.: US 12,506,070 B2
(45) Date of Patent: Dec. 23, 2025

(54) ELECTRONICALLY PROGRAMMABLE FUSE WITH HEATING TRANSISTORS

(71) Applicant: GlobalFoundries U.S. Inc., Malta, NY (US)

(72) Inventors: Shesh M. Pandey, Saratoga Springs, NY (US); Anindya Nath, Essex Junction, VT (US); Alain F. Loiseau, Williston, VT (US); Souvick Mitra, Essex Junction, VT (US); Chung F. Tan, Ballston Spa, NY (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 449 days.

(21) Appl. No.: 18/150,831

(22) Filed: Jan. 6, 2023

(65) Prior Publication Data

US 2024/0234305 A1 Jul. 11, 2024

(51) Int. Cl.
*H01L 23/525* (2006.01)
*H01L 23/34* (2006.01)
*H01L 23/62* (2006.01)

(52) U.S. Cl.
CPC ........ *H01L 23/5256* (2013.01); *H01L 23/345* (2013.01); *H01L 23/62* (2013.01)

(58) Field of Classification Search
CPC ...... H01L 23/5256; H01L 23/62; G11C 17/16
USPC ........................................................ 257/592
See application file for complete search history.

(56) References Cited

U.S. PATENT DOCUMENTS

| | | |
|---|---|---|
| 6,958,523 B2 | 10/2005 | Babcock et al. |
| 7,960,809 B2 | 6/2011 | Kothandaraman et al. |
| 8,143,695 B1 | 3/2012 | Ang et al. |
| 8,236,655 B2 | 8/2012 | Barth et al. |
| 9,659,943 B1 | 5/2017 | Tran et al. |
| 11,289,483 B2 | 3/2022 | Bambery et al. |
| 2006/0208287 A1 | 9/2006 | Lutz et al. |
| 2009/0309167 A1 | 12/2009 | Russ et al. |
| 2010/0133649 A1 | 6/2010 | Lin et al. |
| 2013/0285211 A1 | 10/2013 | Gauthier, Jr. et al. |
| 2014/0131765 A1 | 5/2014 | Tsai et al. |
| 2015/0097266 A1 | 4/2015 | Li et al. |
| 2016/0056162 A1 | 2/2016 | Yeh et al. |
| 2018/0025983 A1 | 1/2018 | Fogel et al. |
| 2018/0061846 A1 | 3/2018 | Gan |
| 2018/0254353 A1 | 9/2018 | Fornara |
| 2020/0266194 A1* | 8/2020 | Bambery ............. H10D 84/038 |
| 2022/0238171 A1* | 7/2022 | Chung ................. G11C 13/003 |
| 2022/0352186 A1* | 11/2022 | Chang .................... G11C 17/16 |

OTHER PUBLICATIONS

European Search Report completed Apr. 19, 2024 for EP Application No. 23202611.2; Reference EP146661-AP249swe; pp. 11.

\* cited by examiner

*Primary Examiner* — Quoc D Hoang
(74) *Attorney, Agent, or Firm* — Francois Pagette; Hoffman Warnick LLC

(57) ABSTRACT

A structure includes: an electrically programmable fuse (e-fuse) including an anode and a cathode; at least one transistor positioned adjacent the e-fuse; and an electrically conductive interconnect coupling the cathode of the e-fuse to the at least one transistor, wherein the at least one transistor includes at least one semiconductor fin extending perpendicularly to the e-fuse.

20 Claims, 7 Drawing Sheets

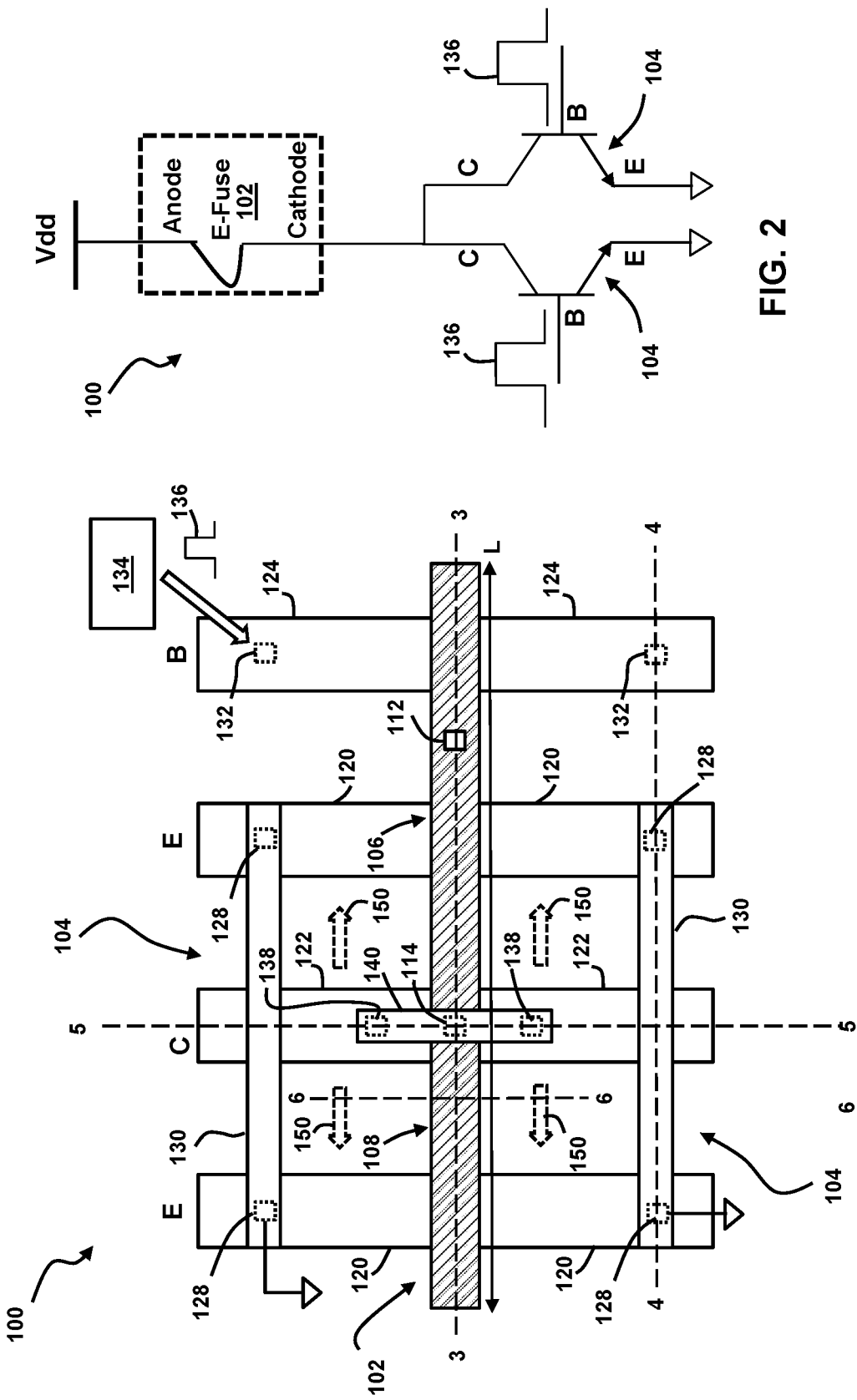

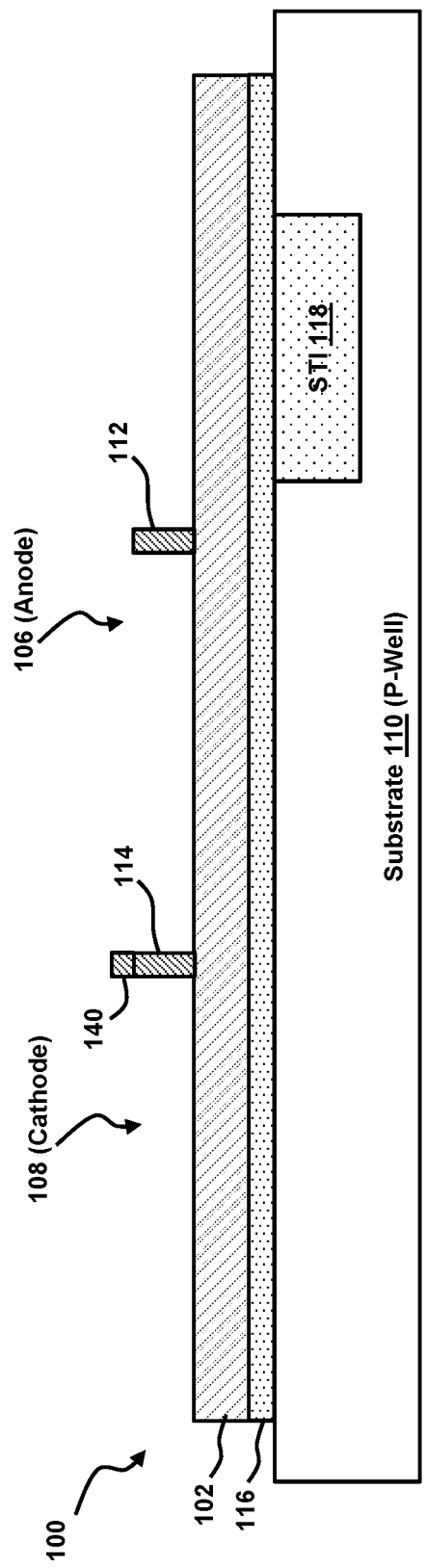
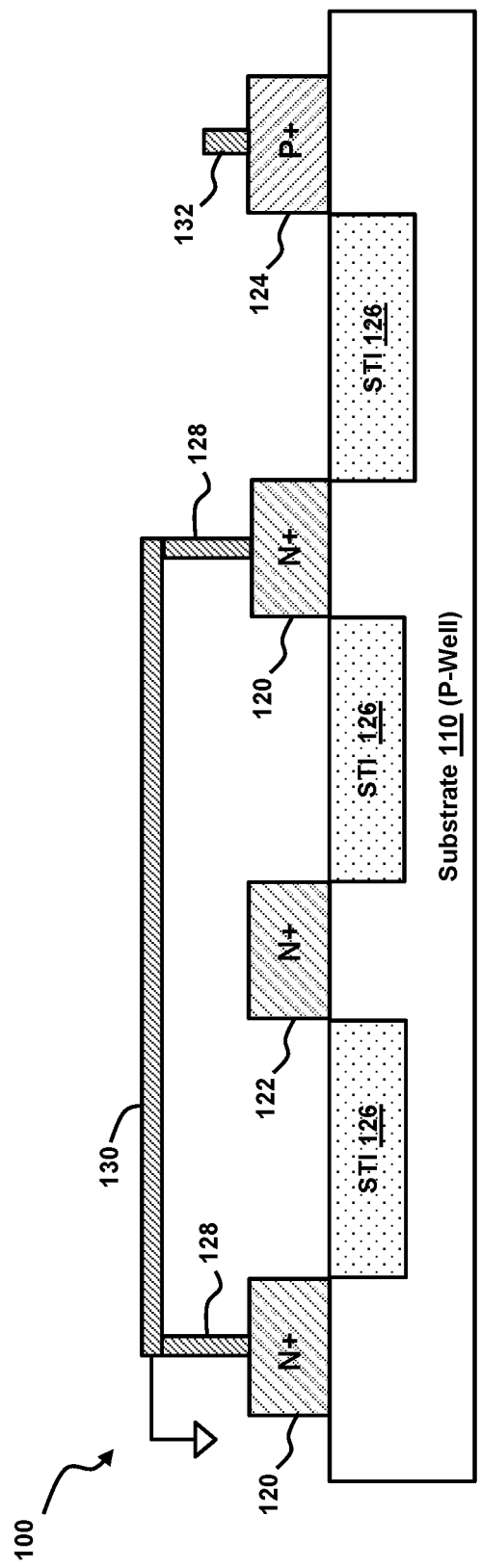

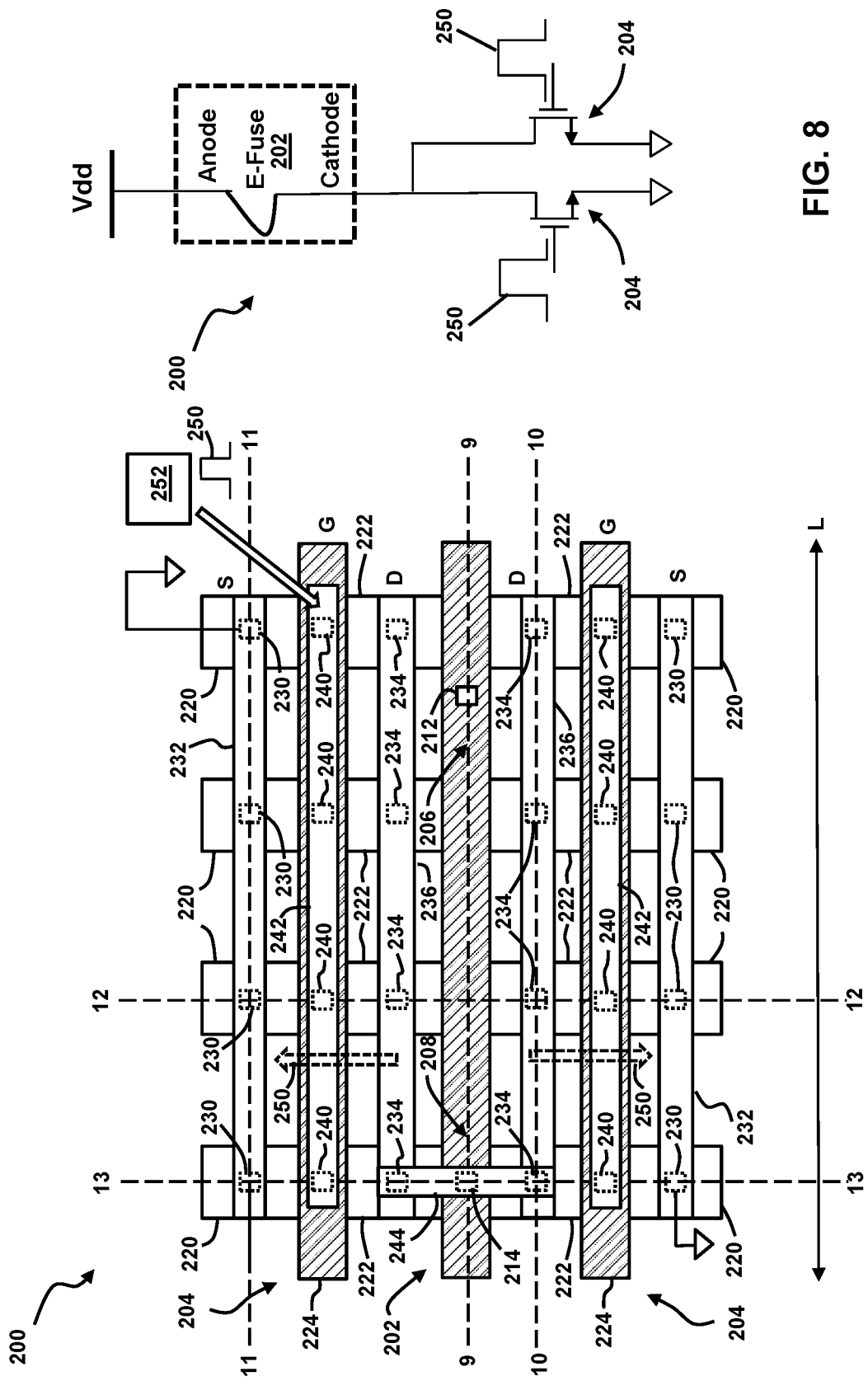

ELECTRONICALLY PROGRAMMABLE FUSE WITH HEATING TRANSISTORS

BACKGROUND

The present invention relates to integrated circuits and, more particularly, to electrically programmable fuses (e-fuses).

E-fuses (also referred to in the art as electronic fuses or electronically programmable fuses) are commonly integrated into integrated circuits as a line of electrically conductive material (e.g. metal, polysilicon, etc.) between respective anode and cathode terminal pads. The resistance of the e-fuse is initially low, and commonly referred to as "closed" in circuit terminology. When a sufficiently large current is applied between the terminal pads of the e-fuse, the line of conductive material is destroyed (blown), thereby changing the resistance of the e-fuse to a much higher level, commonly referred to as "open" in circuit terminology. This technique is commonly referred to as programming the e-fuse.

A high programming current is typically required to program e-fuses. A high programming current is generally not desirable, as a high programming current requires a relatively larger programming transistor, which consumes valuable space on an integrated circuit.

SUMMARY

Aspects of the disclosure include a structure, including: an electrically programmable fuse (e-fuse) including an anode and a cathode; at least one transistor positioned adjacent the e-fuse; and an electrically conductive interconnect coupling the cathode of the e-fuse to the at least one transistor, wherein the at least one transistor includes at least one semiconductor fin extending perpendicularly to the e-fuse.

Aspects of the disclosure further include a structure including: an electrically programmable fuse (e-fuse) on a semiconductor substrate, the e-fuse including an anode and a cathode; at least one Fin-type bipolar-junction-transistor (Fin-BJT) positioned adjacent the e-fuse, wherein a current flowing through the Fin-BJT increases a temperature of the e-fuse, and wherein the at least one Fin-BJT includes: at least one semiconductor fin comprising an emitter of the Fin-BJT; a semiconductor fin comprising a collector of the Fin-BJT; and a semiconductor fin comprising a base of the Fin-BJT; and an electrically conductive interconnect coupling the cathode of the e-fuse to the collector of the at least one transistor.

Aspects of the disclosure further include an electrically programmable fuse (e-fuse) including an anode and a cathode; at least one transistor positioned adjacent the e-fuse; and an electrically conductive interconnect coupling the cathode of the e-fuse to the at least one transistor, wherein the at least one transistor includes a Fin-type field-effect-transistor (Fin-FET), and wherein the at least one semiconductor fin of the transistor includes: at least one semiconductor fin comprising a drain of the Fin-FET; at least one semiconductor fin comprising a source of the Fin-FET; and a gate structure positioned between the drain of the Fin-FET and the source of the Fin-FET; wherein the electrically conductive interconnect couples the cathode of the e-fuse to the drain of the Fin-FET.

BRIEF DESCRIPTION OF THE DRAWINGS

The present invention will be better understood from the following detailed description with reference to the drawings, which are not necessarily drawn to scale. In the drawings, like reference numerals refer to like features in the various views.

FIG. 1 depicts a structure including a polysilicon electrically programmable fuse (e-fuse) and heating transistors in accordance with embodiments of the disclosure.

FIG. 2 is an equivalent electrical circuit for the structure of FIG. 1 according to embodiments of the disclosure.

FIG. 3 is a cross-sectional view taken along line 3-3 in FIG. 1 according to embodiments of the disclosure.

FIG. 4 is a cross-sectional view taken along line 4-4 in FIG. 1 according to embodiments of the disclosure.

FIG. 7 depicts a structure including a polysilicon electrically programmable fuse (e-fuse) and heating transistors in accordance with additional embodiments of the disclosure.

FIG. 8 is an equivalent electrical circuit for the structure of FIG. 7 according to embodiments of the disclosure.

DETAILED DESCRIPTION

Figure 5:
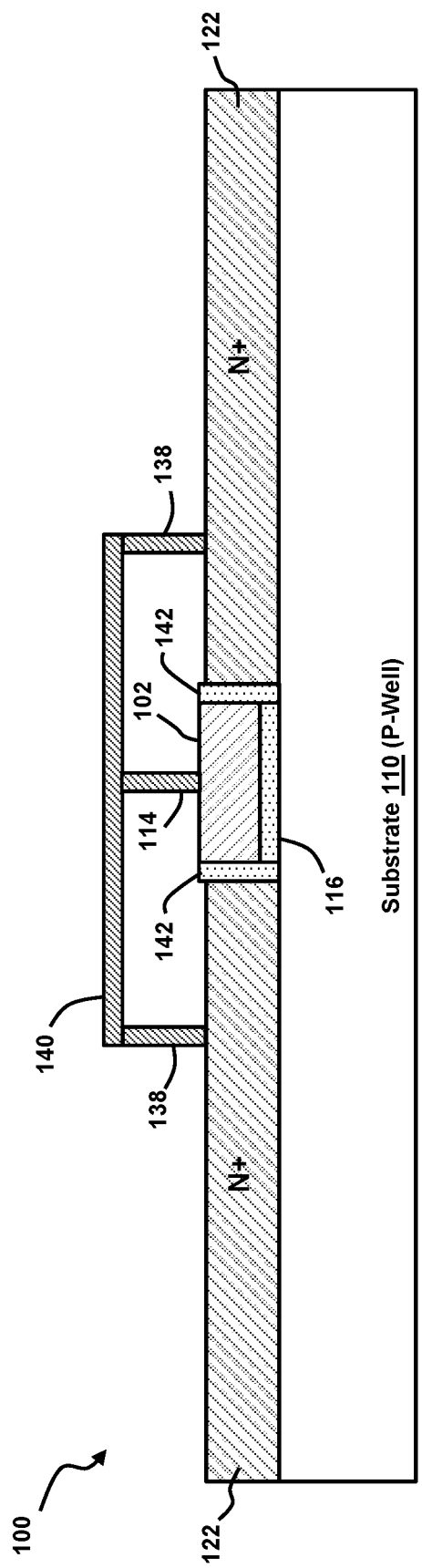
FIG. 5 is a cross-sectional view taken along line 5-5 in FIG. 1 according to embodiments of the disclosure.
Figure 6:
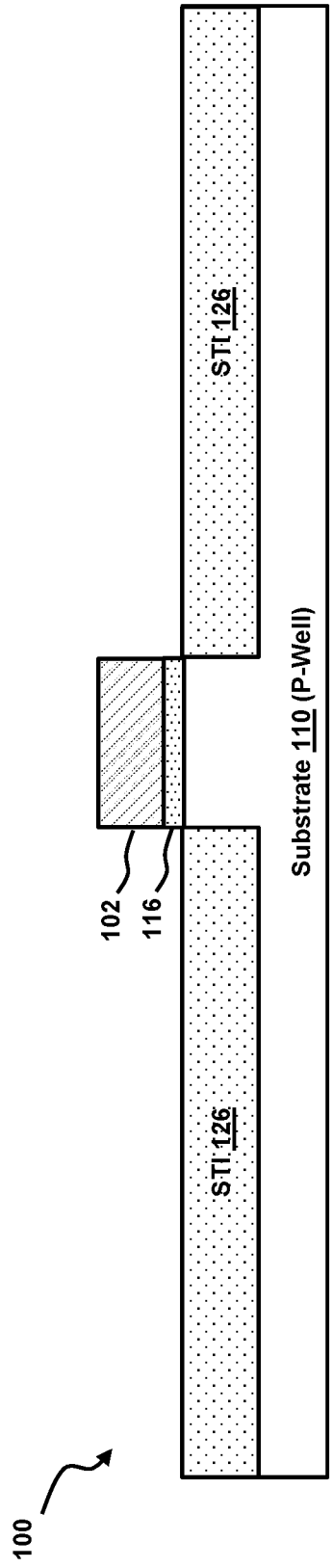
FIG. 6 is a cross-sectional view taken along line 6-6 in FIG. 1 according to embodiments of the disclosure.

With reference to FIG. 1 and in accordance with embodiments of the disclosure, there is depicted a structure 100 including an electrically programmable fuse (e-fuse) 102 and heating transistors 104. An equivalent electrical circuit for the structure 100 of FIG. 1 according to embodiments of the disclosure is depicted in FIG. 2. In operation, a current flowing through the heating transistors 104 of the structure 100 increases the temperature of the e-fuse 102, thereby reducing the programming current required to program (e.g., blow) the e-fuse 102. The e-fuse 102 may be formed of a semiconductor material such as, for example, polysilicon.

As shown in FIG. 1 and the cross-sectional view of FIG. 3, the e-fuse 102 of the structure 100 includes an anode 106 and a cathode 108 and is formed on a P doped substrate 110 (e.g., P-well). An electrically conductive anode contact 112 and an electrically conductive cathode contact 114 are formed on the anode 106 and the cathode 108, respectively, of the e-fuse 102. The e-fuse 102 is separated from substrate 110 by an intervening insulating layer 116. An isolation structure 118 (e.g., a shallow trench isolation structure (STI)) is also formed in the substrate 110. The substrate 110 may be composed of a semiconductor material, such as monocrystalline silicon or other suitable semiconductor substrate materials and/or may be part of a silicon-on-insulator (SOI) wafer that includes the substrate 110, an active layer, and a buried oxide (box) layer between the substrate and the active layer. The insulating layer 116 and the isolation structure 118 (as well as other insulating layers/structures described herein) may be formed of silicon dioxide or other suitable insulating material(s). In the case of an SOI wafer, the insulating layer 116 may be formed by the box layer of the SOI wafer.

The heating transistors 104 are formed on the substrate 110. The heating transistors 104 may be formed from a material such as monocrystalline silicon or other suitable semiconductor materials. According to embodiments, each heating transistor 104 is a Fin-type bipolar-junction-transistor (Fin-BJT) (e.g., an NPN Fin-BJT). An NPN Fin-BJT can include first and second N+ doped semiconductor fins 120 that form the emitter (E) of the heating transistor 104 and a third N+ doped semiconductor fin 122, positioned between the first and second N+ doped fins 120, that forms the collector (C) of the heating transistor 104. As depicted in FIG. 1, the N+ doped fins 120, 122 extend perpendicularly to the e-fuse 102 (e.g., perpendicularly to a length L of the e-fuse 102). Each heating transistor 104 further includes a fourth P+ doped semiconductor fin 124 that forms the base (B) of the heating transistor 104. In some embodiments, the fin 124 may be formed of a material different than that of the fins 120, 122. For example, the fin 124 may be formed of a monocrystalline semiconductor material such as monocrystalline silicon germanium for a heterojunction bipolar transistor (HBT). As depicted in the cross-sectional view of FIG. 4, isolation structures 126 (e.g., (STIs)) are formed in the substrate 110 to electrically isolate the N+ doped fins 120, 122 from each other and from the P+ doped fins 124.

According to embodiments, the fins 120, 122 are doped to have an opposite conductivity than that of the substrate 110 and the fin 124 (e.g., N+ versus P/P+). To this extent, according to other embodiments of the disclosure, the structure 100 may include P+ doped fins 120, 122, an N doped substrate 110, and an N+ doped fin 124 such that each heating transistor is a PNP Fin-BJT as opposed to an NPN Fin-BJT.

As shown in the equivalent circuit of FIG. 2, the heating transistors 104 may be coupled in parallel to the cathode 108 of the e-fuse 102. As further shown in FIG. 1, the heating transistors 104 may be disposed on opposite sides of the e-fuse 102. Each heating transistor 104 is in thermal communication with the e-fuse 102 such that the heat generated by current flowing through the heating transistor 104 is transferred to, and increases the temperature of, the e-fuse 102. Although two heating transistors 104 are included in the structure 100, a single heating transistor 104 or more than two heating transistors 104 may be included in the structure 100.

As shown in FIGS. 1 and 4, an electrically conductive contact 128 is coupled to each of the N+ doped fins 120 of the heating transistors 104. The contacts 128 of each respective heating transistor 104 are coupled together and to ground by an electrically conductive interconnect 130. To this extent, the N+ doped fins 120, and thus the emitter of each of the heating transistors 104, are coupled to ground. Each P+ doped fin 124 also includes an electrically conductive contact 132 that is coupled to a circuit 134 that is configured to provide a heating pulse 136 to the heating transistors 104. Furthermore, as depicted in FIGS. 1 and 5, an electrically conductive contact 138 is coupled to each N+ doped fin 122 of the heating transistors 104. The contacts 138 are coupled together and to the cathode contact 114 by an electrically conductive interconnect 140. As such, the collector of each heating transistor 104 is coupled to the cathode contact 114 of the e-fuse 102 of the structure 100.

Various conventional semiconductor fabrication techniques (e.g., lithography, etching, and/or deposition/growth processes) may be used to form the insulating layer 116 and the isolation structures 118 and 126 on/in the substrate 110. For example, lithography and etching processes may be performed to selectively remove portions of the substrate 110 where the isolation structures 118, 126 are to be formed.

The lithography processes may entail forming an etch mask that includes a layer of a light-sensitive material, such as an organic photoresist, applied by a spin coating process, pre-baked, exposed to light projected through a photomask, baked after exposure, and developed with a chemical developer to form openings in the substrate 110 for the isolation structures 118, 126. The etching process, which removes selective portions of the substrate 110, may be a reactive ion etching process, and the etch mask may be stripped by, for example, plasma ashing, followed by a cleaning process.

After formation of the openings in the substrate 110 for the isolation structures 118, 126, a deposition process may be carried out to form a layer of an insulating material on the substrate 110 and in the openings in the substrate 110. Lithography and etching processes may then be carried out to selectively remove portions of the insulating material such that the openings for the isolation structures 118, 126 in the substrate 110 are filled by the insulating material and the insulating layer 116 is positioned where the e-fuse 102 is to be formed.

Additional lithography and deposition processes may then be employed to form the e-fuse 102 on the insulting layer 116 on the substrate 110. The processes may include, for example, providing a mask with an opening corresponding to the position on the substrate 110 where the e-fuse 102 is to be formed, and depositing a layer of polysilicon through the opening in the mask. Electrically isolating spacers 142, formed of an insulating material, may then be formed on opposing sides of the e-fuse 102, using additional lithography/deposition processes.

Further lithography and deposition processes may be carried out to form the fins 120, 122, 124 on the substrate 110. The processes may include, for example, providing a mask with openings corresponding to the positions on the substrate 110 where the fins 120, 122, 124 are to be formed, and depositing a layer of polysilicon through the openings in the mask. Electrically conductive contacts may then be formed where needed. It should be noted that the structure 100 may be formed using other sequences of semiconductor fabrication processes, and that the above-described sequence of processes in not intended to be limiting in any way.

In operation, a programming current is provided to the anode 106 of the e-fuse 102 through the anode contact 112. The programming current flows through the e-fuse 102 from the anode 106 to the cathode 108. From the cathode 108, the programming current flows through the contacts 114, 138, and interconnect 140 to the N+ doped fin 122 of each heating transistor 104. A heating pulse 134 is provided through the contacts 132 to each P+ doped fin 124, which form the bases of the heating transistors 104. In response to the heating pulse 134, a current 150 (FIG. 1) is generated that flows along a current path parallel to e-fuse 102 (e.g., parallel to a the length L of the e-fuse 102) from the N+ doped fins 122 (collectors of the NPN Fin-BJTs), through the P doped substrate 110 (bases of the NPN Fin-BJTs), and through the N+ doped fins 120 (emitters of the NPN Fin-BJTs) to ground. The current 150 flowing through the heating transistors 104 increases the temperature of the e-fuse 102, thereby reducing the programming current required to program (e.g., blow) the e-fuse 102.

FIG. 7 depicts a structure 200 including an e-fuse 202 and heating transistors 204 in accordance with additional embodiments of the disclosure. An equivalent electrical circuit for the structure 200 of FIG. 7 according to embodiments of the disclosure is depicted in FIG. 8. In operation, a current flowing through the heating transistors 204 of the structure 200 causes the heating transistors 204 to generate heat that, in turn, increases the temperature of the adjacent e-fuse 202, thereby reducing the programming current required to program (e.g., blow) the e-fuse 202. Unlike the heating transistors 104 shown in FIG. 1, which are implemented as Fin-BJTs (e.g., NPN Fin-BJTs), the heating transistors 204 in the structure 200 are Fin-type field-effect-transistors (Fin-FETs) (e.g., N-channel Fin-FETs). The e-fuse 202 may be formed of a semiconductor material such as, for example, polysilicon.

Figure 9:
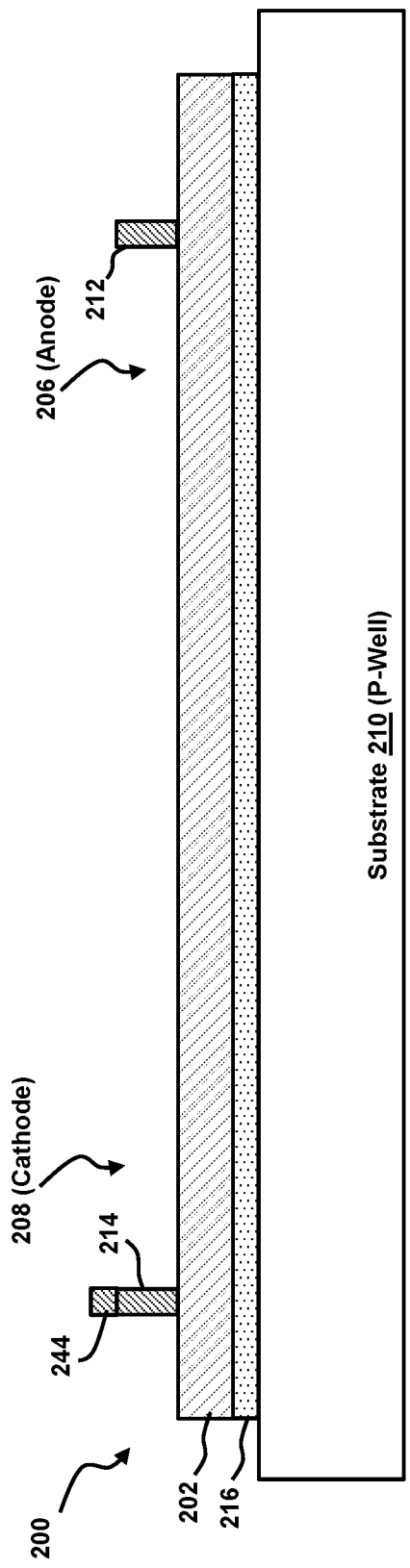
FIG. 9 is a cross-sectional view taken along line 9-9 in FIG. 7 according to embodiments of the disclosure.

As shown in FIG. 7 and the cross-sectional view of FIG. 9, the e-fuse 202 of the structure 200 includes an anode 206 and a cathode 208 and is formed on a P doped substrate 210 (e.g., P-well) formed of a material such as monocrystalline silicon. An electrically conductive anode contact 212 and an electrically conductive cathode contact 214 are formed on the anode 206 and the cathode 208, respectively, of the e-fuse 202. The e-fuse 202 is separated from substrate 210 by an intervening insulating layer 216. The substrate 210 may be composed of a semiconductor material, such as monocrystalline silicon or other suitable substrate material and/or may be part of a silicon-on-insulator (SOI) wafer that includes the substrate 210, an active layer, and a buried oxide (box) layer between the substrate and the active layer. The insulating layer 216 may be formed of silicon dioxide or other suitable insulating material. In the case of an SOI wafer, the insulating layer 216 may be formed by the box layer of the SOI wafer.

The heating transistors 204 are formed on the substrate 210. The heating transistors 204 may be formed from a material such as monocrystalline silicon. According to embodiments, each heating transistor 204 includes a plurality of N+ doped semiconductor fins 220 that form the source of the heating transistor 204, a plurality of N+ doped semiconductor fins 222 that form the drain of the heating transistor 204, and a gate structure 224. As shown, for example, in FIG. 12, the gate structure 224 may include a gate electrode 238 over a gate oxide 270. The gate structure 224 may be formed over a P− doped channel region 272 located between the fins 220, 224. As further depicted in FIG. 7, the N+ doped fins 220, 222 extend perpendicularly to the e-fuse 202 (e.g., perpendicular to a length L of the e-fuse 202).

According to embodiments, the fins 220, 222 are doped to have an opposite conductivity than that of the substrate 210 and channel regions 272 (e.g., N+ versus P+/P−). To this extent, according to other embodiments of the disclosure, the structure 200 may include P+ doped fins 220, 222, an N doped substrate 210, and N-doped channel regions 272 such that each heating transistor is a PNP Fin-FET as opposed to an NPN Fin-FET.

Figure 10:
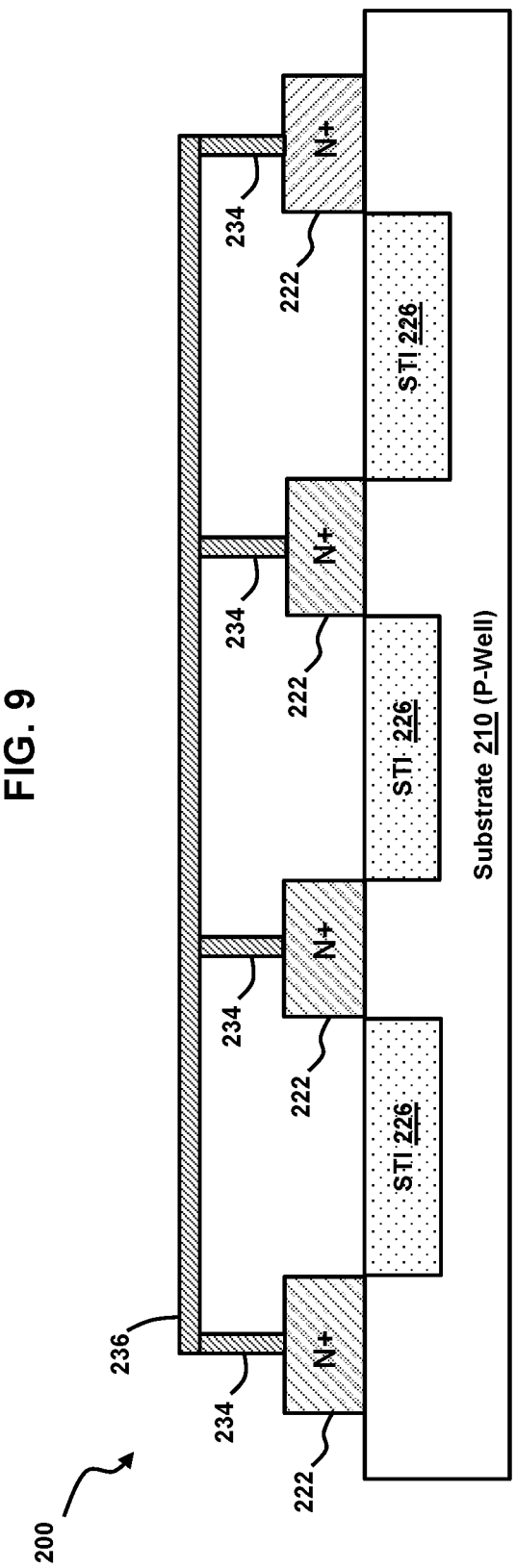
FIG. 10 is a cross-sectional view taken along line 10-10 in FIG. 7 according to embodiments of the disclosure.
Figure 11:
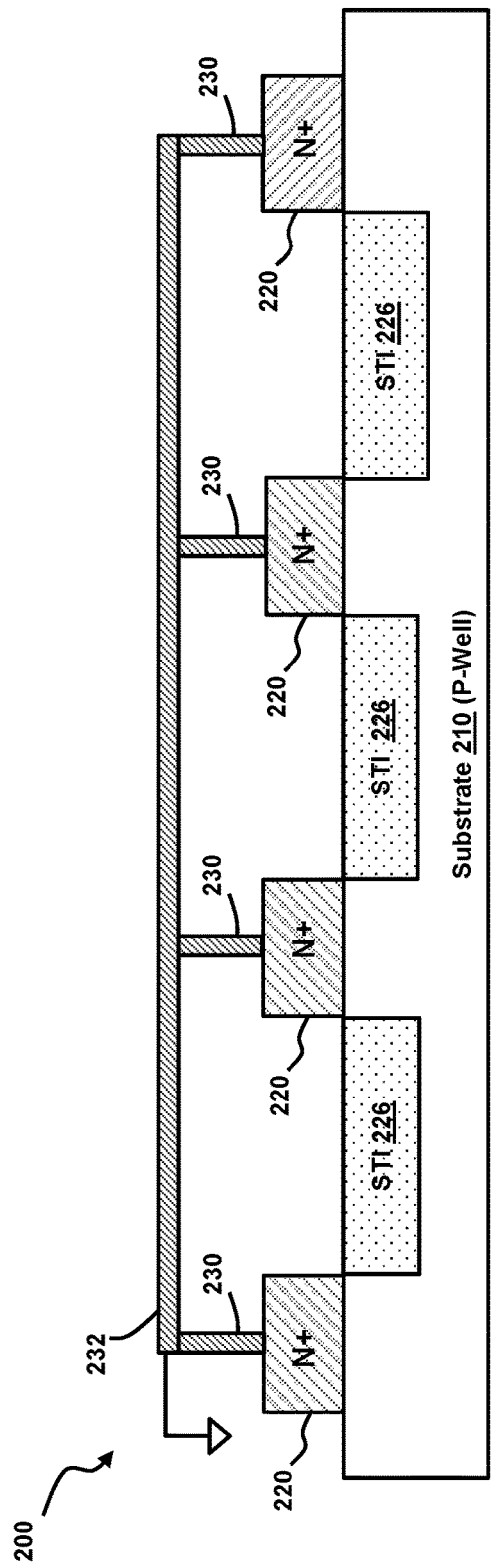
FIG. 11 is a cross-sectional view taken along line 11-11 in FIG. 7 according to embodiments of the disclosure.
Figure 12:
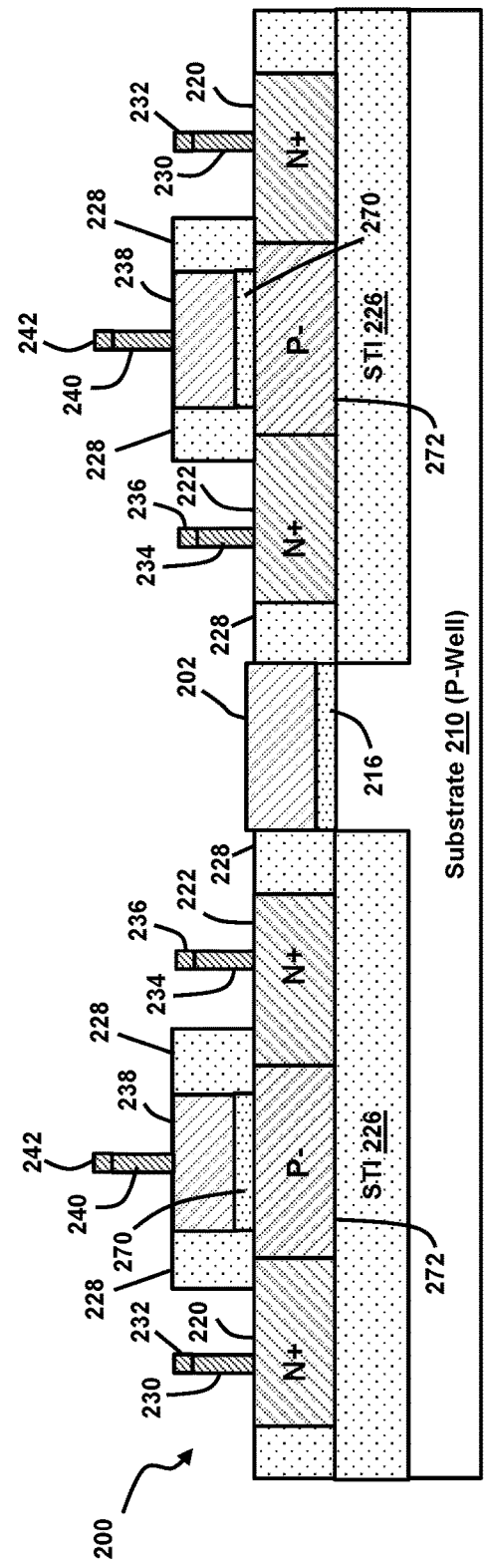
FIG. 12 is a cross-sectional view taken along line 12-12 in FIG. 7 according to embodiments of the disclosure.
Figure 13:
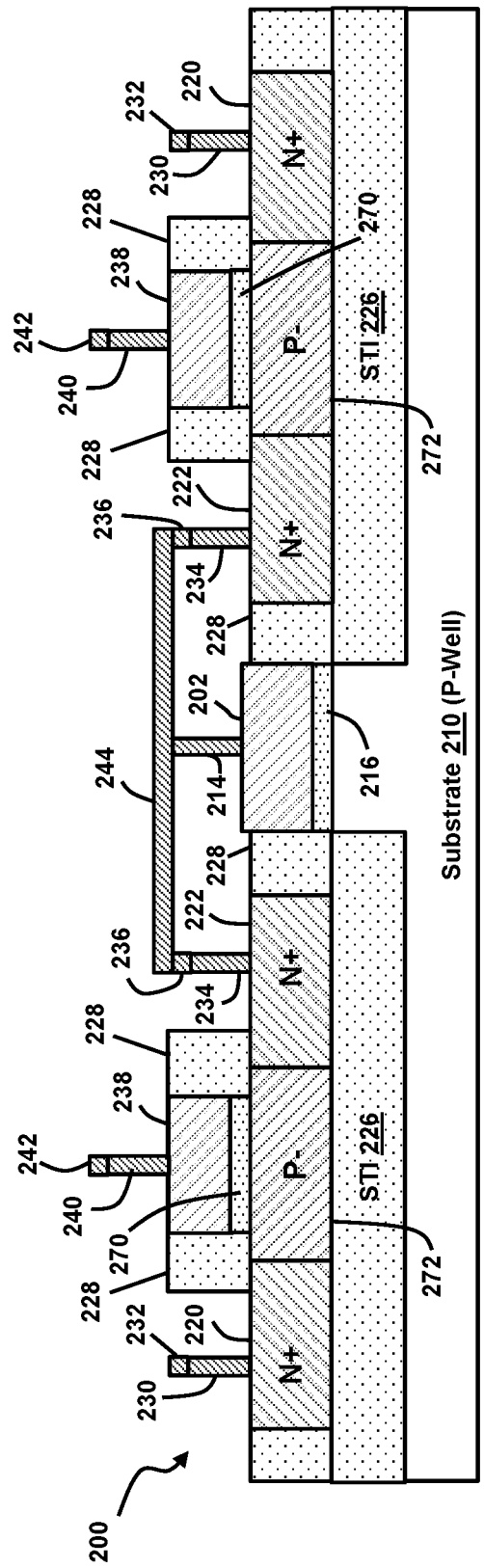
FIG. 13 is a cross-sectional view taken along line 13-13 in FIG. 7 according to embodiments of the disclosure.

As depicted in the cross-sectional views of FIGS. 10 and 11, isolation structures 226 (e.g., (STIs)) are formed in the substrate 210 to electrically isolate the N+ doped fins 220 from each other and to isolate the N+ doped fins 222 from each other. Further, as shown in FIGS. 12 and 13, the isolation structures 236 electrically isolate the gate structures 224 and channel regions 272 from the substrate 210. Spacers 228 (see, e.g., FIG. 12) for electrical isolation are formed on opposing sides of the e-fuse 202 and adjacent the gate structures 224 of the heating transistors 204.

As shown, for example, in FIGS. 7 and 11, an electrically conductive contact 230 is formed on each of the N+ doped fins 220 of the heating transistors 204. The respective contacts 230 of each heating transistor 204 are coupled together and to ground by an electrically conductive interconnect 232. As further shown in FIGS. 7 and 10, an electrically conductive contact 234 is formed on each of the N+ doped fins 222 of the heating transistors 204. The respective contacts 234 of each heating transistor 204 are coupled together by an electrically conductive interconnect 236. The interconnects 236 are coupled together and to the cathode contact 214 by an electrically conductive interconnect 244 (FIGS. 7 and 13). As such, the drain of each heating transistor 204 is coupled to the cathode contact 214 of the e-fuse 202 of the structure 100. As further shown in FIGS. 7, 12, and 13, electrically conductive contact structures 240 are also formed on each gate structure 224, and the respective contacts 240 of each gate structure 224 are connected together by another electrically conductive interconnect 242.

In operation, a programming current is provided to the anode 206 of the e-fuse 202 via the anode contact 212. The programming current flows through the e-fuse 202 from the anode 206 to the cathode 208. The programming current is also applied to the N+ doped fins 222 that form the drain of the heating transistors 204 through the cathode contact 214, the contacts 244, 234, and the interconnect 236.

A heating pulse 250 provided by a suitable circuit 252 is applied to the gate structure 224 of each heating transistor 204 through the contacts 240 and interconnect 242. In response to the heating pulse 250, a current 260 is generated in the heating transistors 204 that flows along a current path perpendicular to the e-fuse 202 (e.g., perpendicular to the length L of the e-fuse 202) from the N+ doped fins 222 (i.e., drain regions), which form the drains of the heating transistors 204, through the channel regions 272, and through the N+ doped fins 220 (i.e., source regions), which form the sources of each heating transistors 204. The current flowing through the heating transistors 204 increases the temperature of the e-fuse 202, thereby reducing the programming current required to program (e.g., blow) the e-fuse 202.

As shown in the equivalent circuit of FIG. 8, the heating transistors 204 may be coupled in parallel to the cathode 208 of the e-fuse 202. As further shown in FIG. 8, the heating transistors 204 may be disposed on opposite sides of the e-fuse 202. Each heating transistor 204 is in thermal communication with the e-fuse 202 such that the heat generated by current flowing through the heating transistor 204 is transferred to, and increases the temperature of, the e-fuse 202. Although two heating transistors 204 are included in the structure 200, a single heating transistor 204 or more than two heating transistors 204 may be included in the structure 200.

It should be understood that in the structures and methods described above, a semiconductor material refers to a material whose conducting properties can be altered by doping with an impurity. Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$).

Exemplary semiconductor materials include, for example, silicon or germanium-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon or germanium-based semiconductor material (e.g., silicon, silicon germanium, silicon germanium carbide, silicon carbide, etc.) is typically doped with a Group III dopant, such as boron (B) or indium (In), to achieve P-type conductivity, whereas such a semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

References herein to terms modified by language of approximation, such as "about," "approximately," and "substantially," are not to be limited to the precise value specified. The language of approximation may correspond to the precision of an instrument used to measure the value and, unless otherwise dependent on the precision of the instrument, may indicate +/−10% of the stated value(s). \

References herein to terms such as "vertical," "horizontal," etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A structure, comprising:
   an electrically programmable fuse (e-fuse) including an anode and a cathode;
   at least one fin-type bipolar-junction transistor (fin-BJT) positioned adjacent the e-fuse, wherein the at least one fin-BJT includes:
   a first fin including an emitter of the Fin-BJT,
   a second fin including a collector of the Fin-BJT, and
   a third fin including a base of the Fin-BJT; and
   an electrically conductive interconnect coupling the cathode of the e-fuse to the at least one transistor, wherein the electrically conductive interconnect couples the cathode of the e-fuse to the collector of the Fin-BJT, and wherein the at least one transistor includes at least one semiconductor fin extending perpendicularly to the e-fuse.

2. The structure according to claim 1, wherein a current flowing through the at least one transistor increases a temperature of the e-fuse.

3. The structure according to claim 1, wherein the emitter of the Fin-BJT is coupled to ground.

4. The structure according to claim 1, wherein the at least one semiconductor fin comprising the emitter of the Fin-BJT includes first and second semiconductor fins disposed on opposing sides of the collector of the Fin-BJT.

5. The structure according to claim 1, wherein the at least one semiconductor fin comprising the emitter of the Fin-BJT, the semiconductor fin comprising the collector of the Fin-BJT, and the semiconductor fin comprising the base of the Fin-BJT are positioned on a semiconductor substrate.

6. The structure according to claim 5, wherein the e-fuse is separated from the semiconductor substrate by a layer of insulating material.

7. The structure according to claim 1, wherein the at least one transistor includes a current path extending parallel to the e-fuse.

8. The structure according to claim 1, wherein the at least one transistor includes first and second transistors coupled in parallel to the cathode of the e-fuse by the electrically conductive interconnect.

9. The structure according to claim 8, wherein the first and second transistors are disposed adjacent opposing sides of the e-fuse.

10. The structure according to claim 1, wherein the e-fuse comprises polysilicon.

11. A structure, comprising:
    an electrically programmable fuse (e-fuse) on a semiconductor substrate, the e-fuse including an anode and a cathode;
    at least one Fin-type bipolar-junction-transistor (Fin-BJT) positioned adjacent the e-fuse, wherein a current flowing through the Fin-BJT increases a temperature of the e-fuse, and wherein the at least one Fin-BJT comprises:
    at least one semiconductor fin comprising an emitter of the Fin-BJT;
    a semiconductor fin comprising a collector of the Fin-BJT; and
    a semiconductor fin comprising a base of the Fin-BJT; and
    an electrically conductive interconnect coupling the cathode of the e-fuse to the collector of the at least one transistor.

12. The structure of claim 11, wherein the at least one semiconductor fin comprising an emitter of the Fin-BJT, the semiconductor fin comprising the collector of the Fin-BJT, and the semiconductor fin comprising a base of the Fin-BJT extend perpendicularly to the e-fuse.

13. The structure of claim 11, wherein the at least one Fin-BJT includes first and second Fin-BJTs coupled in parallel to the cathode of the e-fuse by the electrically conductive interconnect and positioned on opposing sides of the e-fuse.

14. The structure according to claim 11, wherein the e-fuse comprises polysilicon.

15. The structure according to claim 11, wherein the at least one semiconductor fin comprising the emitter of the Fin-BJT includes first and second semiconductor fins disposed on opposing sides of the collector of the Fin-BJT.

16. The structure according to claim 11, wherein the at least one Fin-BJT includes a current path extending parallel to a length of the e-fuse.

17. A structure, comprising:
    an electrically programmable fuse (e-fuse) including an anode and a cathode;
    at least one transistor positioned adjacent the e-fuse; and
    an electrically conductive interconnect coupling the cathode of the e-fuse to the at least one transistor,
    wherein the at least one transistor comprises a Fin-type field-effect-transistor (Fin-FET), and wherein the at least one semiconductor fin of the transistor includes:
    at least one semiconductor fin comprising a drain of the Fin-FET;
    at least one semiconductor fin comprising a source of the Fin-FET; and
    a gate structure positioned between the drain of the Fin-FET and the source of the Fin-FET;
    wherein the electrically conductive interconnect couples the cathode of the e-fuse to the drain of the Fin-FET.

18. The structure according to claim 17, wherein the source of the Fin-FET is coupled to ground.

19. The structure according to claim 17, wherein the at least one transistor includes a current path extending perpendicularly to the e-fuse.

20. The structure according to claim 17, wherein the e-fuse comprises polysilicon.

* * * * *